(12) United States Patent
Yanagida et al.

(10) Patent No.: US 7,858,200 B2
(45) Date of Patent: Dec. 28, 2010

(54) ADHESIVE FILM AND USE THEREOF

(75) Inventors: Masami Yanagida, Otsu (JP); Hisayasu Kaneshiro, Uji (JP)

(73) Assignee: Kaneka Corporation, Osaka (JP)

( * ) Notice: Subject to any disclaimer, the term of this patent is extended or adjusted under 35 U.S.C. 154(b) by 995 days.

(21) Appl. No.: 11/658,422

(22) PCT Filed: Jul. 20, 2005

(86) PCT No.: PCT/JP2005/013324

§ 371 (c)(1),
(2), (4) Date: Jan. 26, 2007

(87) PCT Pub. No.: WO2006/011404

PCT Pub. Date: Feb. 2, 2006

(65) Prior Publication Data

US 2008/0305346 A1 Dec. 11, 2008

(30) Foreign Application Priority Data

Jul. 27, 2004 (JP) ............................. 2004-218684
Sep. 22, 2004 (JP) ............................. 2004-275398

(51) Int. Cl.
B32B 27/06 (2006.01)
B29C 69/02 (2006.01)

(52) U.S. Cl. .................... 428/458; 428/457; 428/473.5; 264/241

(58) Field of Classification Search ........................ None
See application file for complete search history.

(56) References Cited

U.S. PATENT DOCUMENTS

| 5,849,397 | A | 12/1998 | Kohno et al. | |
|---|---|---|---|---|
| 7,267,883 | B2 * | 9/2007 | Fujihara et al. | 428/473.5 |
| 2001/0055691 | A1 | 12/2001 | Yamamoto et al. | |

FOREIGN PATENT DOCUMENTS

| JP | 57-41330 | 9/1982 |
|---|---|---|
| JP | 9-199830 | 7/1997 |
| JP | 10-77353 | 3/1998 |
| JP | 2001-164006 | 6/2001 |
| JP | 2001-270034 | 10/2001 |
| JP | 2002-326280 | 11/2002 |
| JP | 2002-326308 | 11/2002 |
| JP | 2003-335874 | 11/2003 |
| TW | 561100 | 11/2003 |

OTHER PUBLICATIONS

International Search Report for PCT/JP2005/013324 mailed Nov. 22, 2005 (2 pages).
Patent Abstracts of Japan 2001-270034 dated Oct. 2, 2001 (1 page).
Patent Abstracts of Japan 2001-164006 dated Jun. 19, 2001 (1 page).
Patent Abstracts of Japan 2003-335874 dated Nov. 28, 2003 (1 page).
Patent Abstracts of Japan 56-118421 dated Sep. 17, 1981 (1 page).
Chinese Office Action for Chinese Application No. 200580025423.8, mailed on Mar. 27, 2009 (11 pages).
Patent Abstracts of Japan for Japanese Publication No. 09-199830, Publication Date Jul. 31, 1997 (1 page).
Partial Translation for Japanese Publication for Unexamined Patent Application No. 9-199830 (2 pages), Jul. 31, 1997.
Patent Abstracts of Japan for Japanese Publication No. 2002-326280, Publication Date Nov. 12, 2002 (1 page).
Partial Translation for Japanese Publication for Unexamined Patent Application No. 2002-326280 (2 pages), Nov. 12, 2002.
Patent Abstracts of Japan for Japanese Publication No. 2002-326308, Publication Date Nov. 12, 2002 (1 page).
Partial Translation for Japanese Publication for Unexamined Patent Application No. 2002-326308 (2 pages), Nov. 12, 2002.
Patent Abstracts of Japan for Japanese Publication No. 10-077353, Publication Date Mar. 24, 1998 (1 page).
Patent Abstracts of Japanese Publication No. 2001-270034 dated Oct. 2, 2001 (1 page) (Previously Cited).
Partial Translation for Japanese Publication for Unexamined Patent Application No. 2001-270034 (2 pages), Oct. 2, 2001.
Notification of Transmittal of Copies of Translation of the International Preliminary Report on Patentability (Chapter I and Chapter II of the Patent Cooperation Treaty) (5 pages), Jan. 30, 2007.

* cited by examiner

*Primary Examiner*—Monique R Jackson
(74) *Attorney, Agent, or Firm*—Osha Liang LLP

(57) ABSTRACT

Disclosed in an adhesive film which enables to obtain a flexible metal clad laminate which is suppressed in dimensional change when produced by heat roll lamination. Such an adhesive film comprises a heat-resistant layer containing a highly heat resistant polyimide and an adhesive layer which is formed on at least one surface of the heat-resistant layer and contains a thermoplastic polyimide. In this adhesive film, the thermal shrinkage ratio in the TD direction is not less than +0.01%, and the thermal shrinkage ratio in the MD direction is not more than −0.02%. Consequently, when a metal layer and the adhesive film are bonded together by heat roll lamination and the resulting laminate is subjected to a treatment with heating, occurrence of dimensional changes can be sufficiently suppressed.

12 Claims, No Drawings

ADHESIVE FILM AND USE THEREOF

TECHNICAL FIELD

The present invention relates to an adhesive film including a layer made of a polyimide, and typical uses of the adhesive film. Especially, the present invention relates to an adhesive film including (i) a layer made of a highly heat resistant polyimide and (ii) an adhesive layer including a thermal plastic polyimide formed at least one of surfaces of the layer, the adhesive film being preferably applicable to production of flexible printed wiring board. Further, the present invention relates to a production method of the adhesive film and laminates, flexible printed wiring board, etc. to which the adhesive film is used.

BACKGROUND ART

Recently, electronic products have been improved to be lighter in weight, smaller in size, and higher in density, thereby resulting in an increase in the demand for various types of substrates for printed wringing boards, especially, the demand for flexible laminate (which may be referred to as flexible printed wiring boards (hereinafter FPCs) or the like later). The flexible laminate has such a structure that a circuit is formed with a metal foil on an insulating film.

A flexible laminate is generally produced by adhering a metal foil on a substrate by heat and pressure applications with an adhesive material of various kinds therebetween. The substrate is an insulating film being flexible and made of an insulating material of various kinds. The insulating film is preferably a polyimide film or the like. The adhesive material is generally a heat-curable adhesive agent, which is epoxy-based, acryl-based, or the like. (The FPC in which such a heat-curable adhesive agent is used may be refereed to as a three-layered FPC).

The heat-curable adhesive agent is advantageous in that it allows adhesion at a relatively low temperature. However, it is expected that the three-layered FPCs cannot sufficiently satisfy future demands for better heat resistance, flexibility, and electric reliability.

In view of this, FPCs in which a metal layer is formed directly on the insulting film, or in which the adhesive layer is made of a thermoplastic polyimide have been proposed (hereinafter, these FPCs may be referred to as two-layered FPCs). The two-layered FPCs show better characteristics than the three-layered, and higher demands for the two-layered FPCs are expected.

A flexible metal-clad board for a two-layered FPC may be prepared by a casting method, metalizing method, or a laminating method, for example. In the casting method, a polyamide acid, which is a precursor of a polyimide, is cast and spread on a metal foil and is imidated. In the metalizing method, a metal layer is formed directly on a polyimide film by sputtering or plating. In the laminating method, a polyimide film and a metal foil are adhered together via a thermoplastic polyimide.

The laminating method is more excellent than the others because it can provide a wider range of thickness of the metal foil than does the casting method and requires a lower apparatus cost than the metalizing method. As an apparatus for the lamination, heat roll laminating apparatus, double belt press apparatus or the like is used, in which materials in a rolled form are continuously unrolled to be fed in for the lamination. For better productivity, the heat roll lamination method is more preferable among them.

In the production of the conventional three-layered FPC by lamination method, it is possible to carry out the lamination at lamination temperatures less than 200° C. (see Patent citation 1), because a thermosetting resin is used to form the adhesive layer. On the other hand, a thermoplastic resin is used to form the adhesive layer in the two-layered FPC. Therefore, it is necessary for the two-layered FPC to apply a high temperature of 200° C. or higher, in some cases, a temperature of approximately 400° C., in order to heat the adhesive layer to be adhesive.

Incidentally, heat roll lamination method is carried out by conveying a metal foil and an adhesive film through a pair of rollers thereby to press the metal film and the adhesive film together. Therefore, stress is applied on the adhesive film to be extended in its longitudinal direction (hereinafter, "MD direction"), but to be compressed in its width direction (hereinafter, "TD direction"). This stress induces distortion remained in the resultant laminate film. Such distortion would result in dimensional changes when the laminate film is wired by etching and when solder reflow is carried out for mounting elements on the laminate film. More specifically, the heat roll lamination applies a force on the film to swell it in the MD direction but to shrink it in the TD direction. As a result, this distortion is released when etching the metal foil away from a flexible board to be wired and when heating the flexible printed wiring board by solder reflow. The release of the distortion causes shrinkage in the MD direction and swelling in the TD direction.

Recently, the wiring on the substrates is getting finer and finer for the sake of miniaturization and light weight of electronic devices. Accordingly, smaller elements are mounted in higher densities. Therefore, a large dimensional change after the formation of the fine wiring would displace the wires from positions to which the elements are to be mounted according to design, thereby failing to connect the elements with the substrate sufficiently.

In view of this, the following arts for suppressing the dimensional changes have been proposed: (1) arts proposing preferable conditions for the lamination process; and (2) arts proposing preferable ranges of thermal shrinkage ratio of the polyimide film.

The arts proposing preferable conditions for the lamination process are exemplified by an art proposing a pressure to be applied in laminating with pressure and heat application (as described in Patent citation 3), an art proposing a force of tension applied on an adhesive film (as described in Patent citation 2), the other arts. Moreover, the arts proposing preferable ranges of thermal shrinkage ratio of the polyimide film are exemplified by an art proposing an upper limit of the thermal shrinkage ratio of a tape-shape film made of an aromatic polyimide (as described in Patent citation 4), an art proposing an upper limit of the thermal shrinkage ratio of a polyimide film at 300° C., which becomes adhesive by heat and pressure application, an art proposing a lower limit of young modulus and upper limits of the thermal shrinkage ratio at 300° C. and 450° C., and the other arts.

[Patent Citation 1]
 Japanese Unexamined Patent Application Publication, *Tokukaihei*, No. 9-199830 (published on Jul. 31, 1997).

[Patent Citation 2]
 Japanese Unexamined Patent Application Publication, *Tokukai*, No. 2002-326280 (published on Nov. 12, 2002).

[Patent Citation 3]
 Japanese Unexamined Patent Application Publication, *Tokukai*, No. 2002-326308 (published on Nov. 12, 2002).

[Patent Citation 4]
Japanese Unexamined Patent Application Publication, *Tokukaihei*, No. 10-77353 (published on Mar. 24, 1998).

[Patent Citation 5]
Japanese Unexamined Patent Application Publication, *Tokukai*, No. 2001-270034 (published on Oct. 2, 2001).

[Patent Citation 6]
Japanese Unexamined Patent Application Publication, *Tokukai*, No. 2003-335874 (published on Nov. 28, 2003).

However, all the conventional arts do not take into consideration that the flexible printed wiring board prepared via the heat roll lamination process shrinks in the MD direction but expands in the TD direction in etching or heating. Therefore, the conventional arts are not yet practical.

More specifically, for example, the arts disclosed in Patent citations 2 and 3 can sufficiently solve the problems of the dimensional change in the adhesive film in some usages. However, in some cases, the arts disclosed in Patent citations 2 and 3 cannot provide much finer miniaturization and much higher density of the electronic elements that are required recently.

On the other hand, the art disclosed in Patent citation 4 requires that the aromatic polyimide film and the copper foil are adhered together by the adhesive agent, meanwhile the art disclosed in Patent citation 5 requires that the aromatic polyimide layer that becomes adhesive when heat and pressure are applied thereon is provided on at least one surface or preferably both surfaces of a highly heat resistant aromatic polyimide layer. In other words, these arts are suitable for the three-layered FPC but not for the two-layered FPC. Moreover, Patent citation 6 does not mention as to whether the art disclosed therein is suitable for the two-layered FPC or the three-layered FPC, and does not discuss the problem associated with the heat roll lamination.

Therefore, the arts disclosed in Patent citations 4 to 6 do not take the shrinkage in the MD direction and expansion in the TD direction into consideration as the arts disclosed in Patent citations 1 to 2. Thus, in some cases, the arts disclosed in Patent citations 4 to 6 cannot provide finer miniaturization and higher density of the electronic elements that are required recently.

DISCLOSURE OF INVENTION

The present invention is accomplished in view of the aforementioned problems. The present invention provides an adhesive film that is suitably applicable to production of flexible wiring board, and allows a flexible metal-clad laminate produced by a heat roll laminating method to be processed in various processes without much dimensional changes. The present invention also provides examples of use of the adhesive film.

As a result of diligent studies in view of the aforementioned problems, the inventors of the present invention uniquely found that a controlled thermal shrinkage ratio in the adhesive film makes it possible to provide a flexible metal-clad laminate that is produced by the heat roll laminating method and will not be dimensionally changed so much. Based on this finding, the inventors accomplished the present invention. Especially, the present inventions is accomplished based on inventor's finding that it is possible to excellently reduce the occurrences of the dimensional changes by specifying the thermal shrinkage ratios both in the TD direction and MD directions within preferable ranges in consideration with shrinkage of the adhesive film in the MD direction and swelling thereof in the TD direction.

In order to attain the object, an adhesive film according to the present invention includes (i) a heat resistant layer containing a highly heat resistant polyimide, and (ii) an adhesive layer on at least one surface of the heat resistant layer, the adhesive layer containing a thermoplastic polyimide, wherein a thermal shrinkage ratio in a TD direction is +0.01% or more, and a thermal shrinkage ratio in an MD direction is −0.02% or less.

The adhesive film may be preferably arranged such that the heat resistant layer and the adhesive layer on the at least one surface of the heat resistant layer are formed by a coextrusion-flow casting method. As an alternative, the adhesive film may be arranged such that the heat resistant layer and the adhesive layer on the at least one surface of the heat resistant layer are formed by a gel applying method.

The adhesive film may be preferably arranged such that the thermal shrinkage ratio in the TD direction is +0.03% or more, and the thermal shrinkage ratio in the MD direction is −0.05% or less. Further, adhesive film may be preferably arranged such that the adhesive layer is formed on each side of the heat resistant layer. The adhesive film may be preferably arranged such that the heat resistant layer contains a non-thermoplastic polyimide resin by 90 wt. % or more as the highly heat resistant polyimide. The adhesive film may be preferably arranged such that tensile elastic moduli in the TD direction and MD direction are within a range of 5.0 to 11 GPa.

The present invention encompasses a laminate including the adhesive film. Examples of the laminate encompassed in the present invention includes a laminate including a metal layer on the adhesive film, for example, a flexible metal-clad laminate. Moreover, the present invention also encompasses the flexible wiring board including the adhesive film, or the laminate.

Furthermore, the present invention encompasses a method for producing the adhesive film.

More specifically, an example of the method encompassed in the present invention is a method including: concurrently supplying, into an extruder having a dice for extruding in two or more layers, an organic solvent solution containing a polyamide acid that is a precursor of the highly heat resistant polyimide, and either an organic solvent solution containing the thermoplastic polyimide, or an organic solvent solution containing a polyamide acid that is a precursor of the thermoplastic polyimide, and extruding the organic solvent solutions via an outlet of the dice to form a thin film having at least two layers; continuously supplying the extruded organic solvent solutions on a smooth-surfaced supporter, and volatilizing off at least part of an organic solvent or organic solvents from the thin film on the supporter in order to obtain a laminate film that is self-supportive; and holding both edges of the laminate film in the TD direction and subjecting the laminate film to imidation while elongating the laminate film in the TD direction to an elongation ratio of greater than 1.0.

Moreover, the method encompassed in the present invention may be a method including: forming a gel film by shaping, into a film-like shape, an organic solvent solution containing a polyamide acid, which is a precursor of the highly heat resistant polyimide; applying on at least one surface of the gel film an organic solvent solution containing a thermoplastic polyimide or an organic solvent solution containing a polyamide acid that is a precursor of the thermoplastic polyimide, and heating the gel film on which the organic solvent solution is applied; and holding both edges of the laminate film in the TD direction and subjecting the laminate film to imidation while elongating the laminate film in the TD direction to an elongation ratio of greater than 1.0.

The present invention also encompasses a method for producing a flexible wiring board including the adhesive film, or the laminate. More specifically, one example of the method encompassed in the present invention is a method including providing a metal foil on the adhesive film by a heat roll laminating method.

BEST MODE FOR CARRYING OUT THE INVENTION

One embodiment of the present invention is described below. It should be noted that the present invention is not limited to this embodiment and can be embodied with various modifications within the scope described in the following.

(I) Adhesive Film

An adhesive film according to the present invention can suppress dimensional changes excellently even under heat application in various treatments. The adhesive film according to the present invention includes a heat resistant layer containing a heat resistant polyimide and an adhesive layer containing a heat plastic polyimide, the adhesive layer being provided on a surface of the heat resistant layer. The overall adhesive film has a thermal shrinkage ratio of +0.01% or more in its width direction (TD direction), and a thermal shrinkage ratio of −0.02% or less in its longitudinal direction (MD direction).

(I-1) Heat Resistant Layer and Highly Heat Resistant Polyimide Contained Therein <Heat Resistant Layer>

The heat resistant layer of the adhesive film of the present invention contains a polyimide, and is not limited to a particular polyimide, provided that the heat resistant layer is not thermally changed in dimension easily during processes using the adhesive film, or at temperatures to which final products using the adhesive film is generally subjected. However, it is preferable that the heat resistant layer contain a highly heat resistant polyimide. Here, the polyimide being "highly heat resistant" is such a polyimide that heat application approximately in a range of 450° C. to 500° C. will melt the polyimide in a film form but will not lose the film form.

The adhesive film according to the present invention is preferably applicable to the production of the two-layered FPC. When the adhesive film according to the present invention is applied to the production of the two-layered FPC, it is necessary to apply a high temperature of at least 200° C. or more on the adhesive film in order to cause the adhesive film to be adhesive, because the adhesive layer contains the thermally plastic polyimide. Therefore, it is preferable that the heat resistant layer contain a highly heat resistant polyimide that allows the heat resistant layer to be thermally non-deformable and sufficiently stable in shape even under such high temperature conditions.

The present invention is not particularly limited in terms of the highly heat resistant polyimide. Examples of the highly heat resistant polyimide include non-thermally plastic polyimide resin. More specific examples of the highly heat resistant polyimide include various aromatic polyimides. The highly heat resistant polyimide in the present invention is not particularly limited in its molecular structure etc. One preferable example of the molecular structure thereof will be described later, specifically exemplifying an acid dianhydride component and a diamine component as monomer raw materials and a production of a polyimide from the acid dianhydride component and the diamine component.

The heat resistant layer contain a non-thermally plastic polyimide preferably by 90 wt. % or more, and more preferably 95 wt. % or more. In other words, the heat resistant layer may contain a component(s) other than the highly heat resistant polyimide.

The other component(s) may be a resin of various kinds, which can be blended into the highly heat resistant polyimide and will not adversely affect the properties of the heat resistant layer, and/or an additive of various kinds for improving various properties of the heat resistant layer. Above all, it is preferably to add a filler to the highly heat resistant polyimide in the present invention. The addition of the filler improves the resultant adhesive film in various properties such as slidability, heat conductivity, electric conductivity, corona resistance, loop stiffness etc.

The filler to be used in the present invention is not particularly limited. Examples of the filler encompass an inorganic filler made of an inorganic compound of various kinds. More specifically, examples of the inorganic filler encompasses: oxides such as silica, mica, titanium oxide, alumina etc.; inorganic nitrides such as silica nitride, boron nitride, etc.; phosphates such as calcium hydrogen phosphate, calcium phosphate, etc.

The present invention is not particularly limited in terms of particle diameter of the filler, because the particle diameter of the filler is determined according to which film property is to be improved, and which kind of filler is to be added, etc. In general, it is acceptable that the average particle diameter be in a range of 0.05 to 100 µm. It is preferable that the average particle diameter be in a range of 0.1 to 75 µm. It is more preferable that the average particle diameter be in a range of 0.1 to 50 µm. It is further preferable that the average particle diameter be in a range of 0.1 to 25 µm. With particle diameters of the filler less than the range, it becomes difficult to attain property improvements. Particle diameters of the filler greater than the range would cause significant deterioration in surface properties or in mechanical properties.

The present invention is not particularly limited in terms of an amount of the filler to be added, either, because the particle diameter of the filler is determined according to which film property is to be improved, and how large the particle diameter of the filler is, etc. In general, it is acceptable that the amount of the filler to be added be in a range of 0.01 to 100 parts by weight with respect to 100 parts by weight of polyimide. It is preferable that the amount of the filler to be added be in a range of 0.01 to 90 parts by weight with respect to 100 parts by weight of polyimide. It is more preferable that the amount of the filler to be added be in a range of 0.02 to 80 parts by weight with respect to 100 parts by weight of polyimide. When the filler is added in an amount less than the range, it is difficult to attain the property improvements by the addition of the filler. Meanwhile, if the filler was added in an amount greater than the range, the filler would significantly deteriorate the mechanical property of the film.

The thickness of the heat resistant layer is not particularly limited. As described later, it is required that the heat resistant layer have a thickness that will give the resultant adhesive film tension elasticity moduli in the longitudinal direction (MD direction) and width direction (TD direction) of the resultant adhesive film within certain ranges respectively.

Moreover, the thermal expansion coefficient of the heat resistant layer is not particularly limited. However, it is preferable that the thermal expansion coefficient of the heat resistant layer be in a range of 4 to 30 ppm/° C. at a temperature in a range of 50 to 200° C. It is more preferable that the thermal expansion coefficient of the heat resistant layer be in a range of 6 to 25 ppm/° C. at a temperature in a range of 50 to 200°

C. It is further preferable that the thermal expansion coefficient of the heat resistant layer be in a range of 8 to 22 ppm/° C. at a temperature in a range of 50 to 200° C.

When an adhesive film is prepared by combining an adhesive layer with such a heat resistant layer having a thermal expansion coefficient greater than the range, the adhesive film has a thermal expansion coefficient greater than that of the metal foil, whereby the adhesive film and the metal foil in lamination behave greatly differently under heat application. In some cases, this would result in large dimensional change in a flexible metal-clad laminate in which the laminate of the adhesive film and the metal foil is used. On the other hand, when an adhesive film is prepared by combining an adhesive layer with such a heat resistant layer having a thermal expansion coefficient less than the range, the adhesive film has a thermal expansion coefficient smaller than that of the metal foil, whereby, again, the adhesive film and the metal foil in lamination behave much differently under heat application. In some cases, this would also result in large dimensional change in a flexible metal-clad laminate in which the laminate of the adhesive film and the metal foil is used.

<Highly Heat Resistant Polyimide>

The non-thermally plastic polyimide, which is used as the highly heat resistant polyimide of the heat resistant layer, may be produced by preparing a polyamide acid as a precursor and imidating the polyamide acid.

The polyamide acid may be produced by any well-known method and is not limited particularly in terms of how to be produced. A typical method for producing the polyamide acid is as follows: an acid dianhydride component and a diamine component in substantially equimolar amounts are dissolved in an organic solvent and stirred under a controlled temperature condition until polymerization of the acid dianhydride and the diamine is completed. This method produces a solution of a polyamide acid in the organic solvent (hereinafter, this solution is referred to as "polyamide acid solution" for the sake of easy explanation). In general, the polyamide acid solution has a polyamide acid concentration in a range of 5 to 35 wt. %, preferably in a range of 10 to 30 wt. %. With the polyamide acid concentration, the polyamide acid solution can have a molecular weight and solution viscosity preferable in the present invention.

The polyamide acid may be polymerized by any well-known method or a combination of the well-known methods. As to how to carry out the polymerization, the present invention is characterized in a sequence of additions of monomer components. Therefore, it is possible to control various properties of the resultant polyimide by controlling the sequence of the additions of the monomer components. Thus, in the present invention, the sequence of the additions of the monomer components may be determined as appropriate according to the non-thermally plastic polyimide to be obtained finally. That is, the polymerization of the polyamide acid may be carried out by performing the additions of the monomer components in any sequence in the present invention.

As described above, the polymerization of the polyamide acid is not particularly limited in terms of how to perform it. In the following, some typical polymerization methods are exemplified. Note that these polymerization methods may be used solely or in combination partially.

1) After the diamine component is dissolved in an organic polar solvent, the acid dianhydride component in an amount substantially equimolar to the diamine component is added thereto and then the diamine component and the acid dianhydride component are reacted under stirring to polymerize.

2) The acid dianhydride component and the diamine component (in an amount less in mole than the acid dianhydride component) are dissolved in the organic polar solvent and then reacted with each other under stirring, in order to obtain a solution of a prepolymer in the organic polar solvent, the prepolymer having an acid anhydride group or acid anhydride groups respectively on its respective ends. Next, to the solution of the prepolymer, the diamine component is added in an amount that makes up the equimolar amount of diamine component in an overall process with respect to the acid dianhydride component. The resultant solution is then stirred for polymerization.

3) The acid anhydride component and the diamine component (in an amount greater in mole than the acid anhydride component) are dissolved and reacted with each other in the organic polar solvent under stirring, thereby to obtain a solution of a prepolymer in the organic polar solvent, the prepolymer having an amino group or amino groups respectively on its respective ends. Next, to the solution of the prepolymer, the acid dianhydride component is added in an amount that makes up the equimolar amount of the acid dianhydride component in an overall process with respect to the diamine component. The resultant solution is then stirred for polymerization.

4) After the acid dianhydride component is dissolved in the organic polar solvent, the diamine component in an amount substantially equimolar to the acid dianhydride component is added thereto and then the acid dianhydride component and the diamine component are reacted under stirring.

5) The acid dianhydride component and the diamine component in substantially equimolar amounts are dissolved in the organic polar solvent and reacted under stirring for polymerization.

In the polymerization, the monomer components (acid dianhydride component and/or diamine component) may be one compound or include two or more compounds. Moreover, these compounds may not be dissolved in the organic polar solvent due to their solubilities to the solvent. However, the compounds uniformly dispersed in the overall solvent can be regarded as being dissolved therein substantially. Therefore, the term "dissolved" is replaceable with "dispersed" in the explanation on the methods (1) to (5).

The organic polar solvent for use in the polymerization of the polyamide acid can be any solvent and is not particularly limited provided that the organic polar solvent can dissolve polyamide acid therein. Among all, amide-based solvents such as N,N-dimethylformamide, N,N-dimethylacetoamide, N-methyl-2-pyridone, etc. are preferable. N,N-dimethylformamide, N,N-dimethylacetoamide are particularly preferable.

The monomer component for use in the present invention may be any known compound. Particularly, it is preferable for obtaining a highly heat resistant polyimide that both of the acid dianhydride component and the diamine component are aromatic compounds. In the other words, for preparing a polyamide acid solution as a precursor of the highly heat resistant polyimide, the present invention may be preferably arranged such that the acid dianhydride component is an aromatic tetracarboxylic dianhydride, and the diamine component is an aromatic diamine.

Any aromatic tetracarboxylic dianhydride may be used as the acid dianhydride component in the present invention. Specific examples of the aromatic tetracarboxylic dianhydride encompass: pyromellitic dianhydride, 2,3,6,7-naphthalene tetracarboxylic dianhydride, 3,3',4,4'-biphenyltetracarboxylic dianhydride, 1,2,5,6-naphthalene tetracarboxylic dianhydride, 2,2',3,3'-biphenyltetracarboxylic dianhydride, 3,3',4,4'-benzophenonetetracarboxylic dianhydride, 4,4'-oxyphthalic dianhydride, 2,2-bis(3,4-dicarboxylphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxylphenyl)ethane dianhydride, oxydiphthalic dianhydride, bis(3,4-dicarboxyphenyl)sulfone dianhydride, p-phenylenebis(trimellitic acid monoester anhydride), ethylenebis(trimellitic acid monoester anhydride), bisphenol A bis(trimellitic acid monoester anhydride), and the like compounds. These compounds may be used solely or in combination at an appropriate ratios.

Particularly, it is preferable to use at least one compound selected from the group consisting of pyromellitic dianhydride, 3,3',4,4'-benzophenonetetracarboxylic dianhydride, 4,4'-oxyphthalic dianhydride, 3,3',4,4'-biphenyltetracarboxylic dianhydride, among the aromatic tetracarboxylic dianhydrides. Hereinafter, the four compounds consisting the group are referred to as the "preferable acid anhydrides" for easy explanation. It is possible to attain excellent properties of the resultant adhesive film (especially, the heat resistant layer) by using a preferable acid anhydride in the polymerization of the polyamide acid.

In the case where at least one compound selected from the preferable acid anhydrides is used, the amount of the at least one preferable acid anhydride is preferably 50 mol % or more, more preferably 55% or more, and further preferably 60% or more with respect to the overall acid dianhydride component. Moreover, an amount of the at least one preferable acid anhydride below the lower limit would result in that the polyimide film (or the heat resistant layer) has an excessively low glass transition temperature or in that the polyimide film (or the heat resistant layer) has an excessively low storage elasticity modulus under heat application. Such an excessively low glass transition temperature or storage elasticity modulus would make the film production difficult.

Moreover, when pyromellitic dianhydride is used among the preferably dianhydrides, the amount of the pyromellitic dianhydride is preferably in a range of 40 to 100 mol %, and more preferably in a range of 45 to 100 mol %, and further preferably in a range of 50 to 100 mol %. When pyromellitic dianhydride is used in the amount within the ranges, it is easy to attain the resultant polyimide film will have its storage elasticity modulus at heat application and its glass transition temperature within preferably ranges.

Any aromatic diamine may be used as the diamine component in the present invention. Specific examples of the aromatic diamine encompass: 4,4'-diaminodiphenylpropane, 4,4'-diaminodiphenylmethan, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenylsufide, 3,3'-diaminodiphenylsulfone, 4,4'-diaminodiphenylsulfone, 4,4'-oxydianilline, 3,3'-oxydianilline, 3,4'-oxydianilline, 1,5-diaminonaphthalene 4,4'-diaminodiphenyldiethylsilane, 4,4'-diaminodiphenylsilane, 4,4'-diaminodiphenylethylphosphineoxide, 4,4'-diaminodiphenyl N-methylamine, 4,4'-diaminodiphenyl N-phenylamine, 1,4-diaminobenzene(p-phenylenediamine), 1,3-diaminobenzene, 1,2-diaminobenzene, bis{4-(4-aminophenoxy)phenyl}sulfone, bis(4-(3-aminophenoxy)phenyl)sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, 3,3'-diaminobenzophenone, 4,4'-diaminobenzophenone, and the like compounds. These compounds may be used solely or in combination at appropriate ratios.

In the present invention, there are some cases in which it is preferable to use a diamine having a rigid structure (hereinafter, this diamine is referred to as "rigid diamine"). The rigid structure is a group selected from groups represented by the following formula (1):

where $R_1$ is a divalent aromatic group selected from the group (2):

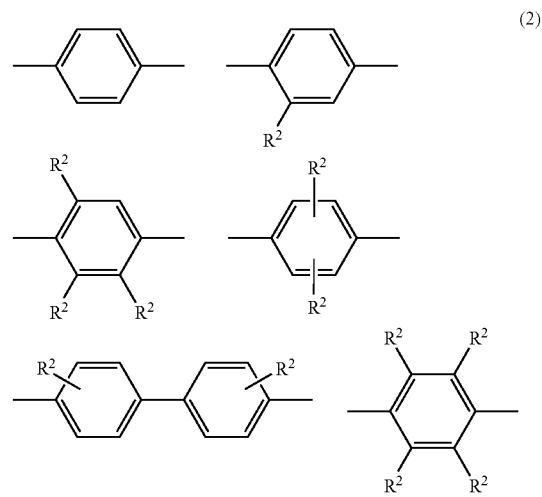

where $R_2$ is, identically or independently, one selected from the group consisting of H—, $CH_3$—, —OH, —$CF_3$, —$SO_4$, —COOH, —$CONH_2$, Cl—, Br—, F—, and $CH_3O$—.

For the polymerization of polyimide acid by using the rigid diamine, the polymerization methods in which a prepolymer is prepared (for example, the method (2) or (3)) are preferable. These polymerization methods tend to make it easier to attain a polyimide film having a high elasticity modulus and small absorption swelling coefficient.

A molar ratio of the rigid diamine and acid dianhydride for the preparation of the prepolymer is not particularly limited. The ratio, rigid diamine: acid dianhydride component, is preferably in a range of 100:70 to 100:99 or in 70:100 to 99:100, and more preferably in a range of 100:75 to 100:90 or 75:100 to 90:100. A molar ratio of the rigid diamine and acid dianhydride below the range makes it difficult to attain the improvement in the elasticity modulus and absorption swelling coefficient. A molar ratio of the rigid diamine and acid dianhydride above the range would cause a problem such as excessively small linear swelling coefficient or a small tensile elongation.

The diamine component may include a diamine having a soft structure (hereinafter, this diamine is referred to as "soft diamine" for easy explanation), together with the rigid diamine. In case where the rigid diamine and soft diamine are used together, a molar ratio, rigid diamine:soft diamine is preferably in a range of 80:20 to 20:80, more preferably in a range of 70:30 to 30:70, and further preferably in a range of 60:40 to 30:70. If the amount of the rigid diamine in the ratio was above the range, the resultant polyimide film (heat resistant layer) would tend to have a small tensile elongation. If the amount of the rigid diamine in the ratio was below the range, the resultant polyimide film (heat resistant layer) would have an excessively low storage elasticity modulus at heat application or an excessively low glass transition temperature, which will make the film formation difficult. Examples of the soft diamine includes diamines having a soft structure such as ether group, sulfone group, ketone group, sulfide group, or the like. A more preferably example of the soft diamine is a diamine represented by the following formula (3):

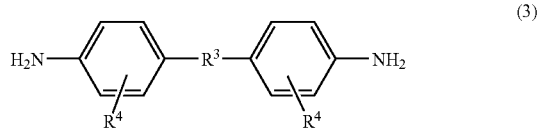

where $R_3$ is a group selected from the groups consisting of divalent organic groups represented by formulae (4), and $R_4$ is a group selected from the groups consisting of H—, $CH_3$—, —OH, —$CF_3$, —$SO_4$, —COOH, —$CONH_2$, Cl—, Br—, F— and $CH_3O$—. Formulas (4) are:

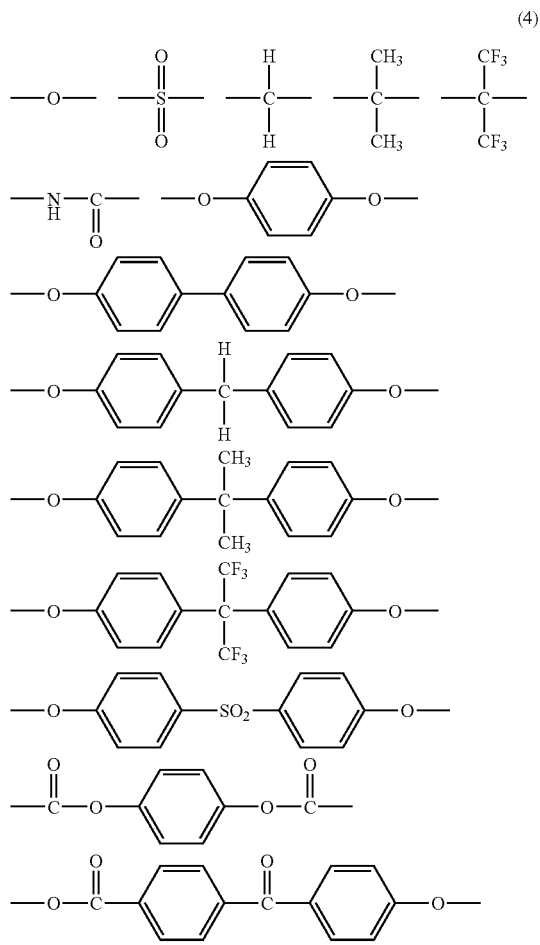

The polyimide film used as the heat resistant layer in the present invention can be prepared with desired properties from the acid dianhydride component and the diamine component whose kinds and mixing ratio are appropriately chosen within the scope mentioned above. Imidation of the polyamide acid is explained in the item "(II) Method for Producing Adhesion Film".

(I-2) Adhesion Layer and Thermoplastic Polyimide for the Same

The adhesion layer of the adhesion film according to the present invention is not particularly limited, provided that it contains a thermoplastic polyimide, and becomes adhesive under a certain condition.

The thermoplastic polyimide (broad sense) contained in the adhesion layer is not particularly limited. Specifically, the thermoplastic polyimide (narrow sense), thermoplastic polyamideimide, thermoplastic polyether imide, thermoplastic polyester imide etc. are preferably applicable as the thermoplastic polyimide (broad sense). Among all, thermoplastic polyester imide is particularly preferably for low moisture absorption. Moreover, the thermoplastic polyimide comprised in the adhesive layer in the claims is the thermoplastic polyimide in the broad sense, which encompasses the various polyimide mentioned above. Moreover, what is meant by the term "thermoplastic polyimide" is the thermoplastic polyimide in the broad sense, unless otherwise specified.

The properties of the thermoplastic polyimide for use in the present invention are not particularly limited. However, it is preferable that the thermoplastic polyimide have a glass transition temperature (Tg) in a certain range among the properties. Specifically, Tg of the thermoplastic polyimide in the present invention is preferably in a range of from 150 to 300° C., and more preferably in a range of 180 to 280° C. Tg can be worked out from a point of inflection of the storage elasticity modulus measured by using a dynamic mechanical analyzer.

The adhesive film of the present invention with the Tg within the range can be laminated with a metal foil by using an existing laminating apparatus, and avoid poor heat resistance of the flexible metal-clad laminate in which the adhesive film is used.

The method for producing the thermoplastic polyimide is not particularly limited. It is possible to produce the thermoplastic polyimide in a manner similar to the production of the highly heat resistant polyimide explained in item (I-1), that is, by polymerizing a polyamide acid as a precursor and then imidating the polymer thus produced. The method of the polymerization of the polyamide acid is not particularly limited. Any well-known method may be adopted for the polymerization. Specifically, the polyamide acid may be produced by selecting the monomer raw materials, production conditions, etc. in the same fashion as explained in item (I-1) for the high heat resistant polyimide.

The thermoplastic polyimide for use in the present invention may be arranged to have various properties by combining the monomer raw materials to use in various ways, like the high heat resistant polyimide. In general, a greater ratio of the rigid diamine in the monomer raw materials results in a greater storage modulus at heat application and/or a higher Tg. This causes poor adhesiveness in the adhesive layer or processability. Thus, a greater ratio of the rigid diamine in the monomer raw materials is not preferable. Therefore, for the production of the thermoplastic polyimide for use in the present invention wherein the diamine component for the polymerization of the precursor of the polyamide acid includes the rigid diamine, the amount of the rigid diamine (rigid diamine content) in the whole diamine component is preferably 40 mol % or less, more preferably 30 mol % or less, and further preferably 20 mol % or less.

Moreover, the adhesive layer may contain an additive of various kinds or a resin other than the polyimide, like the heat resistant layer. For example, the adhesive layer may contain a filler as necessary, like the heat resistant layer. The filler may be, but not limited to, an inorganic filler or an organic filler. The kind and amount of filler to use may be chosen according to the properties desired for the adhesive layer.

The adhesive layer is not particularly limited in terms of its thickness. Like the heat resistant layer, the adhesive layer may be designed to have a thickness that allows the resultant adhesive film to have a tensile elastic modulus in the longitudinal direction (MD direction) and width direction (TD direction) within a certain range.

(I-3) Properties of the Adhesive Film

The adhesive film of the present invention has such a structure that includes the heat resistant layer and the adhesive layer on at least one surface of the heat resistant layer. Thus, the adhesive film of the present invention may have a two-layered structure (heat resistant layer/adhesive layer) or a three-layered structure (adhesive layer/heat resistant layer/adhesive layer), for example. Furthermore, the adhesive film of the present invention may be a lamination of the two-layered structures, or may include a layer other than the heat resistant layer and the adhesive layer if necessary.

<Heat Shrinkage Ratio>

Of the various properties of the adhesive film of the present invention, at least the heat shrinkage ratio should be greater in the TD direction than in the MD direction. The heat shrinkage ratio in the present invention is a value worked out in the following manner:

A measurement sample (adhesive film or a comparative object) is measured in film dimension (L1) after being left in a room adjusted to 23° C. and 55% RH ("RH" stands for relative humidity) for 2 days. Subsequently, the measurement sample is heated at 250° C. for 30 minutes, and then left again in the room adjusted to 25° C. and 60% RH for two days. After that, the measurement sample is measured in the film dimension (L2). The heat shrinkage ratio is worked out from the following equation based on the L1 and L2 thus obtained. The L1 and L2 are lengths in the TD and MD directions of the measured sample.

$$\text{Heat shrinkage ratio} = -(L2-L1)/L1 \times 100 \quad (1)$$

The thermal shrinkage ratio is more specifically explained here. It is acceptable that the thermal shrinkage ratio in the TD direction be +0.01% or more. It is preferably that the thermal shrinkage ratio in the TD direction be +0.03% or more. It is more preferably that the thermal shrinkage ratio in the TD direction be +0.05% or more. On the other hand, It is acceptable that the thermal shrinkage ratio in the MD direction be −0.02% or less. It is preferably that the thermal shrinkage ratio in the MD direction be −0.05% or less. Therefore, when the thermal shrinkage ratios are specified in the TD and MD directions in combination, it is acceptable that the thermal shrinkage ratio in the TD direction be +0.01% or more and the thermal shrinkage ratio in MD direction be −0.02% or less. It is preferable that the thermal shrinkage ratio in the TD direction be +0.03% or more and the thermal shrinkage ratio in MD direction be −0.05% or less. It is more preferable that the thermal shrinkage ratio in the TD direction be +0.05% or more and the thermal shrinkage ratio in MD direction be −0.05% or less.

The adhesive film according to the present invention is suitable applicable to production of the flexible wiring boards by heat roll laminating method. Here, the heat roll laminating method is a method for efficiently producing a metal foil/adhesive film laminate by conveying a metal foil and an adhesive film via a pair of rollers while pressing the metal foil and the adhesive film together by using the rollers. Because the metal foil and adhesive film are adhered together by pressure application using a pair of rollers in the heat roll method, elongating stress is applied on the film in the MD direction while a shrinkage stress is applied on the film in the TD direction.

Due to such stress application, shrinkage distortion remains in the adhesive film in the MD direction, and swelling distortion remains in the adhesive film in the TD direction. These distortions are released when the metal foil/adhesive laminate is etched to form wiring, and when the solder reflow is performed for mounting the elements thereon. The released distortions induce dimensional changes by causing shrinkage in the MD direction and swelling in TD direction. Thus, the laminate produced by the heat roll lamination method using such an adhesive film whose thermal shrinkages are substantially identical in the MD direction and TD direction will be dimensionally changed in the etching step and solder-reflow step, whereby its dimension changes in largely different manners in the MD direction and TD direction.

The conventional arts have not take into consideration the problems of the remained distortions in the TD and MD directions at all. Thus, there has been no technical concept for designing such that the thermal shrinkage ratios in the TD direction and MD direction are different, meanwhile there have been arts in which the thermal shrinkage ratio under a certain condition is specified, as described in Patent Citations 4 to 6. Based on this technical concept, it is found in the present invention that the non-uniformity in the dimensional changes in the MD direction and TD direction can be reduced effectively by setting such that the thermal shrinkage ratio in the TD direction is higher than that in the MD direction. The specific ranges of the thermal shrinkage ratios are diligently studied. As a result, it is found that the non-uniformity in the dimensional changes in each direction especially in the production of the laminate including the lamination structure of the metal foil/adhesive film by the heat roll laminating method can be effectively reduced by specifically setting a lower limit in the thermal shrinkage ratio in the TD direction and an upper limit in the thermal shrinkage ratio in the MD direction as described above.

<Tensile Elastic Modulus>

The adhesive film of the present invention is not particularly limited in terms of the other properties, but it is preferable that the tensile elastic modulus be within a certain range. Specifically, the tensile elastic modulus is preferably in a range of 5.0 to 11 GPa, and more preferably in a range of 5.5 to 10 GPa in both the MD and TD directions. Moreover, the tensile elastic modulus may be measured in accordance with ASTM D882 by using the autograph S-100-C made by Shimazu corp.

If the tensile elastic modulus is below the range, the process for laminating using the resultant film will be performed with greater susceptibility of the film to the tensile. The greater susceptibility of the film to the tensile results in different thermal stresses between the MD and TD directions, thereby causing a greater dimensional changes in the resultant laminate (flexible metal-clad laminate or the like). On the other hand, a tensile elastic modulus above the range would result in poor flexibility of the resultant flexible metal-clad laminate.

In general, the adhesive layer containing the thermoplastic polyimide is smaller in the tensile elastic modulus than the heat resistant layer containing the high heat resistant polyimide. A greater ratio of the adhesive layer in thickness tends to lower the tensile elastic modulus of the adhesive film. Therefore, the thicknesses of the heat resistant layer and the adhesive layer constituting the adhesive film may be arbitrarily designed to attain a satisfactory tensile elastic modulus and a total thickness that is required for usage. It should be noted that the present invention is not limited to the three-layered structure (adhesive layer/heat resistant layer/adhesive layer with thickness of 2 μm/10 μm/2 μm) exemplified in Examples later described.

<Heat Swelling Coefficient>

In the adhesive film of the present invention, it is also preferable that the coefficient of thermal expansion be within a certain range. As later described, the adhesive film of the present invention is suitably applicable to an embodiment in which the adhesive film is processed to a flexible metal-clad laminate, that is an embodiment in which a metal foil is adhered on at least one surface of the adhesive film. For the sake of better dimensional stability in the flexible metal-clad laminate produced using the adhesive film, it is preferable that the adhesive film have a coefficient of thermal expansion equivalent to that of the metal foil.

More specifically, it is preferable that the coefficient of thermal expansion of the adhesive film be +/−6 ppm/° C. from that of the metal foil at a temperature of 200 to 300° C. If the coefficient of thermal expansion of the adhesive film was out of the range, the coefficients of thermal expansion of the adhesive film and the metal foil to be clad thereon become too largely different from one another, which results in large differences in swelling and shrinking behaviors of the adhesive film and metal foil when laminating them. As a result, distortion would remain in the flexible metal-clad laminate, and removal of the metal foil would cause a large dimensional change.

The coefficient of the thermal expansion of the adhesive film is adjustable by changing the ratio of the heat resistance layer and the adhesive layer in thickness.

(II) Method for Producing the Adhesive Film (II-1) Method for Producing the Adhesive Film by Gel-Applying Method The adhesive film of the present invention may be produced in any way, provided that the adhesive film including the heat resistant layer and adhesive layer can be produced. The adhesive layer of the present invention may be provided on one or two surfaces of the heat resistant layer by a "gel-applying method".

The "gel-applying method" is a method including flow-casting, on a supporter, the solution of the polyamide, which is the precursor of the high heat resistant polyimide, drying the solution and partially imidating the polyamide, in order to form a self-supportive intermediate product in a film form (hereinafter, this intermediate product is referred to as "gel film"), and applying, on at least one surface of the gel film, a solution containing the thermoplastic polyimide, or a solution of the polyamide acid which is the precursor of the thermoplastic polyimide.

More specifically, the production method according to the present invention for producing the adhesive film may be explained as a method including the gel film forming step for forming the gel film and the laminating step for laminating the thermoplastic polyimide or the precursor thereof on the gel film. Further, the production method according to the present invention may very preferably include the elongating and imidating step for imidating the lamination film obtained by the laminating step, while elongating the lamination film in the TD direction.

<Gel Film Forming Step>

The gel film forming step in the production method according to the present invention is not particularly limited, provided that the gel film forming step forms the gel film by processing into a film-like shape a solution containing an organic solvent and the polyamide acid, which is the precursor of the highly heat resistant polyimide (hereinafter, this solution is referred to as a "highly heat resistant polyimide precursor solution" for the sake of easy explanation). In other words, the gel film forming step may be referred to as the heat resistant layer forming step.

The gel film may be obtained by extruding the highly heat resistant polyimide precursor solution on a smooth-surfaced supporter via a dice continuously thereby to form a smooth layer, and heating the smooth layer in order to volatilize off (dry off) part of the solvent and to proceed the imidation at least partially. The supporter is not particularly limited and may be an endless belt or a drum, which has a surface from which the gel film can be easily removed. The endless belt or the drum is not particularly limited in terms of a material of its surface. For example, the surface of the endless belt or the drum may be made of a metal or a fluoride resin or the like. The dice is not particularly limited in terms of its material or structure. The size and structure of the dice may be chosen as most appropriate according to the thickness and width of the heat resistant layer, size and structure of the adhesive film to be obtained finally, or kind and properties of the highly heat resistant polyimide precursor solution.

Thermal curing method (thermal imidation method) and chemical curing method (chemical imidation method) are most widely known as imidation methods. The thermal curing method carries out the imidation only by heat application. The chemical curing method carries out the imidation by using a chemical dehydrating agent. Either of these methods may be employed, but the chemical curing method (chemical imidation method) is preferred for higher productivity.

The chemical dehydrating agent is not particularly limited, provided that it is a dehydrating ring-closing agent for the polyamide acid. For example, a main component of the chemical dehydrating agent may preferably be an aliphatic acid anhydride, an aromatic acid anhydride, N,N'-dialkylcarbodimide, a lower aliphatic halide, a halogenated lower aliphatic acid anhydride, aryl sulfonic acid dihalide, thionyl halide, or a mixture of two or more of them. Of these compounds, the aliphatic acid anhydride, and the aromatic acid anhydride are especially preferable as the main component of the chemical dehydrating agent.

Moreover, the chemical curing method (chemical imide method) may be carried out with a curing agent containing the chemical dehydrating agent and a catalyst. The catalyst is not particularly limited, provided that the catalyst has a component that encourages the dehydrating ring-closing process of the polyamide acid by the chemical dehydrating agent. More specifically, for example, aliphatic tertiary amines, aromatic tertiary amines, and heterocyclic tertiary amines may be the catalyst. Of these compounds, nitrogen-containing heterocyclic compounds such as imidazole, benzimidazole, isoquinoline, quinoline, and β-picoline, etc. are especially preferable.

How much the chemical dehydrating agent and the catalyst are used is not particularly limited, provided that the amounts of the chemical dehydrating agent and the catalyst allow a desired extent of the imidation. However, the chemical dehydrating agent may be used preferably in a range of 0.5 to 5 mol, and more preferably in a range of 0.7 to 4 mol per one mol of the amide acid unit in the polyamide acid in the solution of the polyamide acid, to which the chemical dehydrating agent and catalyst are to be added. Moreover, the catalyst may be used preferably in a range of 0.05 to 3 mol, and more preferably in a range of 0.2 to 2 mol per one mol of the amide acid unit in the polyamide acid in the solution of the polyamide acid, to which the chemical dehydrating agent and catalyst are to be added. If either of the amounts of the chemical dehydrating agent and the catalyst was below the range, the chemical imidation would be insufficient. Such insufficient chemical imidation would possibly cause a damage or cleavage of the film during sintering, or give the film a poor mechanical strength. Moreover, if either of the amounts of the chemical dehydrating agent and the catalyst was above the range, the imidation would possibly proceed too rapidly and make it difficult to cast the solution to attain the film shape.

The highly heat resistant polyimide precursor solution may contain the inorganic filler as described above I-1. The inorganic filler may be added to highly heat resistant polyimide precursor solution in any way. More specifically, for example, the inorganic filler may be added (1) into the polymerization reaction solution before or during the polymerization of the polyamide acid, (2) by adding and kneading the filler into the polyamide acid solution by a three-shaft roller after the completion of the polymerization of the polyamide acid, or (3) by preparing a dispersion solution of the filler separately and adding the dispersion solution into the polyamide acid solution.

The method (3) in which the dispersion containing the filler is added into the polyamide acid solution is preferable among these methods. Especially, this method makes it possible to mix the filler right before the formation of the gel film. Thus, this method is most effective to reduce an amount of the filler left in the production line for the adhesive film, and possibility of filler contamination associated with the leftover filler.

The dispersion solution of the filler may be prepared in any way. The dispersion solution may be prepared by adding into an appropriate solvent the filler to use. It is preferable that the solvent of the dispersion solution and that of the polyamide acid solution be the same organic polar solvent. For better or stable dispersion of the filler, an additive such as a dispersing agent, a thickener, or other agent may be added therein as long as the additive does not adversely affect the film property.

<Laminating Step>

The laminating step is not particularly limited, as long as it is a step including (i) applying, on at least one surface of the gel film prepared in the gel film forming step, the organic solvent solution containing the thermoplastic polyimide (hereinafter, this organic solvent solution is referred to as "thermoplastic polyimide solution" for the sake of easy explanation), or the organic solvent solution containing the polyamide acid, which is the precursor of the thermoplastic polyimide (hereinafter, this organic solvent solution is referred to as "thermoplastic polyimide precursor solution" for the sake of easy explanation), and (ii) heating the thermoplastic polyimide solution or thermoplastic polyimide precursor solution thus applied on the gel film.

The thermoplastic polyimide solution or thermoplastic polyimide precursor solution may be applied on the surface of the gel film in any way. For example, conventionally known application methods such as flow-casting, spraying, immersing, and the other methods may be employed as appropriate. It should be noted that the present invention is not limited to the flow-casting via the dice, which was employed in Examples later described.

The gel film on which the thermoplastic polyimide solution or thermoplastic polyimide precursor solution is applied is dried by volatizing off the solvent by heating. The drying may be carried out in any way and may be carried out by any well-known methods. Heating and/or sending air to the gel film is easiest. The heating should not be carried out with such a high temperature that will volatilize the solvent off rapidly. Such rapid volatilization of the solvent leaves holes that will be fine defects in the adhesive film finally obtained. Thus, it is preferably that the temperature of the heating be not more than a temperature greater than the boiling point of the solvent by 50° C.

The heating method for drying the applied flow-casting of thermoplastic polyimide precursor solution in the gel film forming step is not particularly limited in terms of the may be carried out by any heating method. As in the laminating step, any well-known method may be employed. The heating/and or sending air to the film may be preferably employed to dry the applied flow-casting of thermoplastic polyimide precursor solution in the gel film forming step.

<Elongating and Imidating Step>

The elongating and imidating step in the production method according to the present invention is not particularly limited, provided that the elongating and imidating step performs the imidation on the laminate film (obtained in the laminating step) held at both ends of the TD directions and elongated in the TD direction to an elongation ratio of greater than 1.0.

As described above, the adhesive film of the present invention is arranged such that the thermal shrinkage in the TD direction is higher than that in the MD direction. This arrangement of the thermal shrinkage ratios may be attained in any way. One example to attain this arrangement is to elongate the laminate film in the TD direction under heat application.

The elongation ratio, which should be greater than 1.0, is preferably 1.1 or greater but 2.0 or smaller. The elongating is not particularly limited in terms of the heating temperature to be applied therefor. It is acceptable that the heating temperature to be applied for the elongating be 100° C. or more. It is preferable that the heating temperature to be applied for the elongating be 200° C. or more. The heating temperature within the temperature range allows the laminate film to be elongated without causing physical damages on the laminate film.

The imidation in the elongating and imidating step may be carried out as described in the explanation on the gel film forming step. Considering the productivity of the adhesive film, it is especially preferable that the imidation and the elongating be performed concurrently. Specifically, the laminate film may be elongated under a temperature in a range of 250° C. to 600° C. to heat the laminate film sufficiently. By this, the elongating, substantial removal of the solvent, and the imidation can be performed concurrently.

(II-2) Method for Producing Adhesive Film by Coextrusion-Flow Casting Method

The production method according to the present invention for producing the adhesive film may be performed by a coextrusion-flow casting method, besides the method described in "(II-1) Method for Producing the Adhesive Film by Gel-Applying Method". The coextrusion-flow casting method is a film producing method including supplying, at the same time, the high heat resistant polyimide precursor solution and either the thermoplastic polyimide solution or the thermoplastic polyimide precursor solution into an extruder having a dice for extruding in two or more layers, and extruding the solutions in two or more thin films via an outlet of the dice. The solutions are continuously extruded on the smooth-surfaced supporter via the dice for extruding in two or more layers. Then, at least part of the solvent is volatilized off from the multi-layered thin film on the supporter. In this way, a self-supportable multi-layered film is obtained. Further, this method may be arranged such that the multi-layered film is peeled off from the supporter and the multi-layered film is heated sufficiently at a temperature in a range of 250° C. to 600° C. This substantially removes the solvent from the multi-layered film and proceeds the imidation therein, thereby obtaining the targeted adhesive film. Moreover, the imidation rate may be low and/or the solvent may be remained, in order to attain better flowability of the adhesive layer at melting.

This adhesive film according to the present invention is an adhesive film including a highly heat resistant polyimide layer and a thermoplastic polyimide layer formed on at least one surface of the highly heat resistant polyimide layer, the highly heat resistant polyimide layer and the thermoplastic polyimide layer being formed by a coextrusion-flow casting method. It is preferable in the adhesive film according to the present invention that a thermal shrinkage ratio be +0.01% or more in a TD direction, and a thermal shrinkage be −0.02% or less in a MD direction. It is more preferable in the adhesive film according to the present invention that a thermal shrinkage ratio be +0.03% or more in the TD direction, and a thermal shrinkage be −0.05% or less in the MD direction. It is especially preferable in the adhesive film according to the present invention that a thermal shrinkage ratio be +0.05% or more in the TD direction, and the thermal shrinkage be −0.05% or less in a MD direction. A heat roll lamination method is a method that can effectively produce a metal-clad laminate film by using a pair of rollers that press the metal foil and adhesive film together while conveying them. Because the thermal laminating method, which adheres the metal foil and adhesive film together by pressing them by using the pair of rollers, elongating stress is applied on the films in the MD direction while shrinkage stress is applied on the films in the TD direction. Due to these stresses, shrinkage distortion is remained in the MD direction while swelling distortion is remained in the TD direction. These distortions are released when the metal-foil laminate film is etched to form wiring, and when the solder reflow is performed for mounting the elements thereon. The released distortions induce dimensional changes by causing shrinkage in the MD direction and swelling in TD direction. Therefore, the metal-clad laminate produced by the heat roll lamination method using such an adhesive film whose thermal shrinkages are substantially identical in the MD direction and TD direction will be dimensionally changed in the etching step and solder-reflow step, whereby its dimension changes in largely different manners in the MD direction and TD direction. In order to reduce this non-uniformity, it is effect to arranged such that the thermal shrinkage ratio in the TD direction is greater than that in the MD direction.

This arrangement of the thermal shrinkage ratios may be attained in any way. As described in "(II-1) Method for producing the Adhesive Film by Gel-Applying Method", one preferable example to attain this arrangement is to perform the elongating in the TD direction at a temperature of 100° C. or more, preferably 200° C. or more. Considering the productivity, it is especially preferable that the imidation and the elongating be performed concurrently.

There is no particular limit in how to volatilize off the solvent from the highly heat resistant polyimide precursor solution and either the thermoplastic polyimide solution or the thermoplastic polyimide precursor solution extruded from the dice. As described above, it is the easiest way to perform the volatilization by heating and/or sending air to the film, as described in "(II-1) Method for producing the Adhesive Film by Gel-Applying Method". As described above, the solvent will be volatilized off rapidly if the temperature in the heating is too high. Such rapid volatilization would leave spots and there cause fine defects in the finally obtained adhesive film. Thus, it is preferable that the temperature in the heating be higher than a temperature higher than the boiling point of the solvent by less than 50° C.

The "dice for extruding in two or more layers" is not particularly limited, provided that the dice is for producing a multi-layered film. The dice may have any conventionally known structure. Especially preferable examples of the dice include a feed block dice, and a multi manifold dice.

In the "method for producing the adhesive film by the coextrusion-flow casting method", either the thermal curing method or chemical curing method can be adopted. For a higher productivity, it is especially preferable to employ the chemical curing method. The chemical curing method may be performed as described in the explanation in "(II-1) Method for producing the Adhesive Film by Gel-Applying Method".

(III) Applicability of the Present Application

The adhesive film according to the present invention is preferably applicable to production of a laminate including a polyimide layer. That is, the scope of the present invention encompasses laminates produced by using the adhesive film. Specifically, the laminate may have any structure. Typically, the laminate may have a structure in which a metal layer is provided on the surface of the adhesive film.

The laminate may be produced in any way. One example is to adhere a metal foil on at least one surface of the adhesive film according to the present invention by laminating method, preferably, heat roll laminating method.

The metal layer to be provided on the adhesive film is not particularly limited. In case where the flexible metal-clad laminate using the laminate according to the present invention is applied to electronic apparatus, electric apparatus, the metal layer may be a metal foil made of cupper, copper alloy, stainless steel, stainless steel alloy, nickel, nickel alloy (encompassing 42 alloy), aluminum, aluminum alloy, or the like. Moreover, copper foils such as rolled copper foil, electrolysis cupper foil are generally used in the flexile metal-clad laminates. These copper foils can be used in the present invention preferably. The metal foil may be provided an anti-corrosion layer, a heat resistant layer, or an adhesive layer on its surface.

The scope of the present invention encompasses the adhesive film, and the flexible wiring board prepared using the laminate. Specifically, the scope of the present invention encompasses flexible printed wiring boards (FPCs). The method for producing the flexible printed wiring board is not particularly limited. One specific example of producing the flexible printed wiring board is to provide a metal foil on the adhesive film and performing pattern etching on the laminate thus formed, thereby to process the metal foil into a pattern circuit. In the present invention, the production of the flexible wiring board may employ the heat roll laminating method in providing the metal foil on the adhesive film. This can prevent the dimensional change in various processes to which the flexible metal-clad laminate produced by the heat roll laminating method is to be subjected.

In the following, the present invention is explained more specifically, referring to Examples and Comparative Examples. It should be noted that the present invention is not limited to them. A person skilled in the art can make various changes, correction, or modification on the present invention within the scope of the present invention. The heat shrinkage ratio and dimensional changing ratio were measured as below.

[Heat Shrinkage Ratio]

A squared sample of about 20 cm×20 cm in size was cut out from a prepared adhesive film, two edges of the squared sample being along the MD direction of the adhesive film and the other two edges thereof being along the TD direction. The squared sample was used as a heat shrinkage ratio measuring sample.

For two days, the heat shrinkage measuring sample was left in a room adjusted to 23° C. and 55% RH. Then, a film dimension (L1) of the heat shrinkage measuring sample was measured. Then, the heat shrinkage ratio measuring sample was heated at 250° C. for 30 minutes. Then, the heat shrinkage ratio measuring sample was left for two days in the room adjusted to 25° C. and 60% RH. Then, a film dimension (L2) of the heat shrinkage ratio measuring sample was measured. Then, the heat shrinkage ratio was calculated out from the following Equation (1) and evaluated.

$$\text{Heat Shrinkage Ratio} = -(L2-L1)/L1 \times 100 \quad (1)$$

[Dimensional Change Ratio]

The dimensional changing ratio before and after the removal of the metal foil was measured and calculated out in the following manner, referring to JIS C6481. From a flexible metal-clad laminate, a squared sample of about 20 cm×20 cm in size was cut out. A hole of 1 mm in diameter were then opened at each corner of a square shape of about 15 cm×15 cm in size on a surface of the sample. Here, two edges of the squared sample of 20 cm×20 cm and two edges of the square shape of 15 cm×15 cm were along the MD direction and the other two edges of the squared sample of 20 cm×20 cm and other two edges of the square shape of 15 cm×15 cm were along the TD direction. Moreover, centers of the squared sample and the square shape were substantially overlapped. Then, the metal foil was etched away from the sample (flexible metal-clad laminate with four holes). The etched sample was then left in a thermostatic room at 23° C. and 55% RH for 24 hours. The sample was heated at 250° C. for 30 minutes and then left in the thermostatic room at 23° C. and 55% RH for 24 hours. Where D1 was a measured distance between adjacent holes of the four holes of the flexible metal-clad laminate before etching, and D2 was a measured distance between the hole adjacent holes of the flexible metal-clad laminate after etching and heating, the dimensional changing ratio before and after the heating was calculated out by the following Equation (2), and evaluated. The dimensional changing ratio was measured in each of the MD direction and TD direction.

$$\text{Dimensional Change Ratio (\%)} = \{(D2-D1)/D1\} \times 100 \quad (2)$$

Synthesis Example 1 of Polyamide Acid

Polyamide Acid as Precursor of Highly Heat Resistant Polyimide

Into 239 kg of N,N-dimethylformamid (hereinafter, referred to as "DMF" where appropriate) cooled to 10° C., 6.9 kg of 4,4-oxydianiline (hereinafter, referred to as "ODA"), 6.2 kg of p-phenylenediamine (hereinafter, referred to as "p-PDA" where appropriate), and 9.4 kg of 2,2-bis[4-(4-aminophenoxy)phenyl]propane (hereinafter, referred to as "BAPP") were dissolved. Then, 10.4 g of pyromellitic dianhydride (hereinafter, referred to as "PMDA" where appropriate) was added in the thus prepared solution, and dissolved under stirring for 1 hour. Further, 20.3 kg of benzophenonetetracarboxylic dianhydride (hereinafter, referred to as "BTDA") was added and dissolved under stirring for 1 hour. In this way, a reaction solution was prepared.

The DMF solution of PMDA (PMAD:DMF=0.9 kg: 7.0 kg), which solution was prepared separately, was gradually added into the reaction solution until a viscosity of $1 \times 10^2$ Pa·sec. After that, the reaction solution was stirred for 1 hour to attain an organic solvent solution of an polyamide acid (a1) (hereinafter, referred to as "polyamide acid solution (a1)" for the sake of easy explanation), which had a solid content of 18 wt. %, and a rotational viscosity of 3500 poise at 23° C.

Synthesis Example 2 of Polyamide Acid

Polyamide Acid as Precursor of Highly Heat Resistant Polyimide

Into 239 kg of DMF cooled to 10° C., 12.6 kg of ODA, 6.8 kg of p-PDA, and 15.6 kg of PMDA were added and dissolved under stirring for 1 hour. Into the thus obtained solution, 12.2 kg of BTDA was added and dissolved under stirring for another 1 hour. Into the thus obtained solution, 5.8 kg of p-phenylenebis (trimellitic monoester acid anhydride) (hereinafter, referred to as "TMHQ") was added and dissolved under stirring for 2 hours. In this way, a reaction solution was prepared.

The DMF solution of PMDA (PMAD:DMF=0.9 kg: 7.0 kg), which solution was prepared separately, was gradually added into the reaction solution until a viscosity of $1 \times 10^2$ Pa·sec. After that, the reaction solution was stirred for 1 hour to attain an organic solvent solution of an polyamide acid (a2) (hereinafter, referred to as "polyamide acid solution (a2)" for the sake of easy explanation), which had a solid content of 18 wt. %, and a rotational viscosity of 3500 poise at 23° C.

Synthesis Example 3 of Polyamide Acid

Polyamide Acid as Precursor of Thermoplastic Polyimide

Into a reaction vessel of 300 L in volume, 78 kg of DMF, and 11.72 kg of bis[4-(4-aminophenoxy)phenyl]sulfone (hereinafter, referred to as "BAPS" where appropriate) were added. Then, 7.17 kg of 3,3',4,4'-biphenyltetracarboxylic dianhydride (hereinafter, referred to as "BPDA") was gradually added in the thus obtained solution with stirring under nitrogen atmosphere. Subsequently, 0.56 kg of 3,3',4,4'-ethyleneglycoldibenzoatetetracarboxylic dianhydride (hereinafter, referred to as "TMEG") was added in the solution. Then, the solution was stirred for 30 minutes in an ice bath. Into the thus prepared reaction solution, a separately-prepared solution of 0.55 kg of TMEG dissolved in 2 kg of DMF was gradually added under stirring, while monitoring a viscosity of the reaction solution. The addition was ceased when the viscosity reached $1 \times 10^2$ Pa·sec. After 146.3 kg of DMF was further added therein, the solution was stirred for a sufficient time period to obtain an organic solvent solution of a polyamide acid (b1) (hereinafter, referred to as "polyamide acid solution (b1)").

Synthesis Example 4 of Polyamide Acid

Polyamide Acid as Precursor of Thermoplastic Polyimide

Into a reaction vessel of 300 L in volume, 78 kg of DMF, and 11.56 kg of 2,2-bis[4-(4-aminophenoxy)phenyl]propane (BAPP) were added. Then, 7.87 kg of 3,3,4,4'-biphenyltetracarboxylic dianhydride (BPDA) was gradually added in the thus obtained solution with stirring under nitrogen atmosphere. Subsequently, 0.38 kg of TMEG was added in the solution. Then, the solution was stirred for 30 minutes in an ice bath. Into the thus prepared reaction solution, a separately-prepared solution of 0.2 kg of TMEG dissolved in 2 kg of DMF was gradually added under stirring, while monitoring a viscosity of the reaction solution. The addition was ceased when the viscosity reached $1 \times 10^2$ Pa·sec. After 146.3 kg of DMF was further added therein, the solution was stirred for a sufficient time period to obtain an organic solvent solution of a polyamide acid (b2) (hereinafter, referred to as "polyamide acid solution (b2)").

Synthesis Example 5 of Polyamide Acid

Polyamide Acid as Precursor of Thermoplastic Polyimide

Into a glass flask of 2000 ml in volume, 780 g of DMF and 117.2 g of BAPS were added. Then, 71.7 g of BPDA was gradually added into the thus obtained solution under stirring in nitrogen atmosphere.

After 5.6 g of TMEG was then added therein, the solution was stirred in an ice bath for 30 minutes. Into the thus prepared reaction solution, a separately-prepared solution of 5.5 g of TMEG in 20 g of DMF was gradually added under stirring, monitoring a viscosity of the reaction solution. When the viscosity reached $1 \times 10^2$ Pa·sec, the addition and stirring was ceased. In this way, a solution of a polyamide acid, which was a precursor of a thermoplastic polyimide was obtained, (hereinafter, the solution is referred to as "polyamide acid solution (b3)").

Synthesis Example 6 of Polyamide Acid

Polyamide Acid as Precursor of Thermoplastic Polyimide

Into a glass flask of 2000 ml in volume, 780 g of DMF and 115.6 g of BAPP were added. Then, 78.7 g of BPDA was gradually added into the thus obtained solution under stirring in nitrogen atmosphere.

After 3.8 g of TMEG was then added therein, the solution was stirred in an ice bath for 30 minutes. Into the thus prepared reaction solution, a separately-prepared solution of 2.0 g of TMEG in 20 g of DMF was gradually added under stirring, monitoring a viscosity of the reaction solution. When the viscosity reached $1 \times 10^2$ Pa·sec, the addition and stirring was ceased. In this way, a solution of a polyamide acid, which was a precursor of a thermoplastic polyimide was obtained (hereinafter, the solution is referred to as "polyamide acid solution (b4)").

Example 1

Into the polyamide acid solution (a1) prepared in Synthesis Example 1 (the polyamide acid was the precursor of a highly heat resistant polyimide), acetic anhydride and isoquinoline were added as a chemical dehydrating agent and a catalyst, respectively. As to their amounts, acetic anhydride was 2 mol and isoquinoline was 0.5 mol per one mole of the amide acid unit of the polyamide acid (a1).

Next, the polyamide acid solution (a 1) was continuously extruded via a three-layer multi manifold dice (hereinafter, this dice may be referred to as "T dice") and cast on an endless belt (made of stainless steel) in such a manner that it would be in approximately 10 μm in thickness after drying, the endless belt having been running 20 mm below the T dice. The film of the polyamide acid (a) was heated at 130° C. for 100 seconds, and then peeled off from the endless belt. In this way, a gel film (a1) that was self-supportable was obtained.

Using two T dices, the polyamide acid solution (b1) (the polyamide was the precursor of a thermoplastic polyimide) was applied continuously on both sides of the gel film (a1) in such a manner that the layers thus formed would be 2 μm in thickness after drying. Then, the layers were heated at 150° C. for 30 seconds. The thus obtained film was fixed on tenter clips. While elongating the film to an elongation ratio of 1.1 in the TD direction by distancing the tenter clips from each other, the film was dried and imidated at 300° C. for 30 seconds, at 400° C. for 50 seconds, and at 450° C. for 10 seconds. In this way, an adhesive film according to the present invention was obtained. The adhesive film had a highly heat resistant polyimide layer of 10 μm in thickness and thermoplastic polyimide layers of 2 μm in thickness on both the sides of the highly heat resistant polyimide layer.

On each side of the thus prepared polyimide laminates, a 118 μm rolled copper foil (BHY-22B-T, Japan Energy Corp.) and Apical 125 NPI (Kaneka Corp.) on top of each copper foil were thermally laminated continuously with a polyimide laminate's tension of 0.4N/cm, lamination temperature of 380° C. and lamination pressure of 196N/cm (20 kgf/cm) at lamination speed 1.5 m/min. The Apical 125NPI was a protective material. By such thermal lamination, a flexible copper-clad laminate was obtained.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 1.

Example 2

An adhesive film and a flexible metal-clad laminate according to the present invention were produced in the same fashion as in Example 1, except that the polyamide acid solution (a2) was used in replacement of the polyamide acid solution (a1) as the polyamide acid being the precursor of the highly heat resistant polyimide.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 1.

Example 3

An adhesive film and a flexible metal-clad laminate according to the present invention were produced in the same fashion as in Example 1, except that the polyamide acid solution (b2) was used in replacement of the polyamide acid solution (b1) as the polyamide acid being the precursor of the thermoplastic polyimide.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 1.

Example 4

An adhesive film and a flexible metal-clad laminate according to the present invention were produced in the same fashion as in Example 2, except that the polyamide acid solution (b2) was used in replacement of the polyamide acid solution (b1) as the polyamide acid being the precursor of the thermoplastic polyimide.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 1.

Comparative Example 1

An adhesive film and a flexible metal-clad laminate were produced in the same fashion as in Example 1, except that the obtained film fixed using the tenter clips was elongated in the TD direction to an elongation ratio of 1.0.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 1.

Comparative Example 2

An adhesive film and a flexible metal-clad laminate were produced in the same fashion as in Example 2, except that the obtained film fixed using the tenter clips was elongated in the TD direction to an elongation ratio of 1.0.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 1.

TABLE 1

|  | Thermal Shrinkage Ratio (%) | | Dimensional Change (%) | |
| --- | --- | --- | --- | --- |
|  | TD direction | MD direction | TD direction | MD direction |
| Example 1 | +0.07 | −0.08 | +0.05 | −0.02 |
| Example 2 | +0.05 | −0.09 | +0.06 | −0.06 |
| Example 3 | +0.03 | −0.06 | +0.07 | −0.08 |
| Example 4 | +0.03 | −0.05 | +0.06 | −0.07 |
| Comparative Example 1 | +0.00 | −0.01 | +0.17 | −0.15 |
| Comparative Example 2 | +0.00 | −0.01 | +0.18 | −0.19 |

As shown in Table 1, the flexible metal-clad laminates with thermal shrinkage ratio out of the prescribed range showed large dimensional changes, while those with thermal shrinkage ratio within the prescribed range showed small dimensional changes.

Example 5

The following chemical dehydrating agent and catalyst were added to the polyamide acid solution (a1) (the polyamide was a precursor of the highly heat resistant polyimide) prepared in Synthesis Example 1.

As a chemical dehydrating agent, acetic anhydride was added to the polyamide acid solution (a1) in such an amount that acetic anhydride of 2 mol was added per one mole of the amide acid unit of the polyamide acid (a1) as the precursor of the highly heat resistant polyimide. Moreover, as a catalyst, isoquinoline was added to the polyamide acid solution (a1) in such an amount that isoquinoline of 1 mol was added per one mole of the amide acid unit of the polyamide acid (a1) as the precursor of the highly heat resistant polyimide.

Further, the following chemical dehydrating agent and catalyst were added to the polyamide acid solution (b3) (the polyamide was a precursor of the thermoplastic polyimide) prepared in Synthesis Example 5.

As a chemical dehydrating agent, acetic anhydride was added to the polyamide acid solution (b3) in such an amount that acetic anhydride of 2 mol was added per one mole of the amide acid unit of the polyamide acid (b3) as the precursor of the thermoplastic polyimide. Moreover, as a catalyst, isoquinoline was added to the polyamide acid solution (b3) in such an amount that isoquinoline of 0.5 mol was added per one mole of the amide acid unit of the polyamide acid (b3) as the precursor of the thermoplastic polyimide.

Next, the polyamide acid solutions were continuously extruded via a three-layer multi manifold dice (hereinafter, this dice may be referred to as "T dice") and cast on an endless belt (made of stainless steel) in such a manner that the polyamide acid solution (b3) formed outer layers and the polyamide acid solution (a1) formed an inner layer, the endless belt having been running 20 mm below the T dice. The thus prepared resin film was heated at 130° C. for 100 seconds, and then peeled off from the endless belt. In this way, a gel film that was self-supportable was obtained. The thus obtained film was fixed on tenter clips. While elongating the film to an elongation ratio of 1.1 in the TD direction by distancing the tenter clips from each other, the film was dried and imidated at 300° C. for 30 seconds, at 400° C. for 50 seconds, and at 450° C. for 10 seconds. In this way, an adhesive film according to the present invention was obtained. The adhesive film had a highly heat resistant polyimide layer of 17 μm in thickness and thermoplastic polyimide layers of 4 μm in thickness on both the sides of the highly heat resistant polyimide layer. On each side of the thus prepared adhesive film, a 18 μm rolled copper foil (BHY-22B-T, Japan Energy Corp.) and Apical 125 NPI (Kaneka Corp.) on top of each copper foil were thermally laminated continuously with a polyimide laminate's tension of 0.4N/cm, lamination temperature of 380° C. and lamination pressure of 196N/cm (20 kgf/cm) at lamination speed 1.5 m/min. The Apical 125NPI was a protective material. By such thermal lamination, a flexible copper-clad laminate was obtained. A thermal shrinkage ratio of the thus obtained adhesive film was calculated from Equation (1), and evaluated. Further, dimensional change of the flexible metal-clad laminate were calculated from Equation (2) and evaluated. The results are shown on Table 2.

Example 6

An adhesive film and a flexible metal-clad laminate according to the present invention were produced in the same fashion as in Example 5, except that the polyamide acid solution (a2) was used in replacement of the polyamide acid solution (a1) as the polyamide acid being the precursor of the highly heat resistant polyimide.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 2.

Example 7

An adhesive film and a flexible metal-clad laminate according to the present invention were produced in the same fashion as in Example 5, except that the polyamide acid solution (b4) was used in replacement of the polyamide acid solution (b3) as the polyamide acid being the precursor of the thermoplastic polyimide.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 2.

Example 8

The polyamide acid solution (a1) (the precursor of the highly heat resistant polyimide) prepared in Synthesis Example 1, and the polyamide acid solution (b3) (the precursor of the thermoplastic polyimide) prepared in Synthetic Example 5 were continuously extruded via a three-layer multi manifold dice in such a manner that the polyamide acid solution (b3), the polyamide acid solution (a1), and the polyamide acid solution (b3) was extruded in this lamination. The extruded solutions cast on an endless belt (made of stainless steel). The thus prepared resin film was heated at 130° C. for 600 seconds, and then peeled off from the endless belt. In this way, a gel film that was self-supportable was obtained. The thus obtained film was fixed on tenter clips. While elongating the film to an elongation ratio of 1.1 in the TD direction by distancing the tenter clips from each other, the film was dried and imidated at 200° C. for 300 seconds 300° C. for 300 seconds, at 400° C. for 300 seconds, and at 450° C. for 60 seconds. In this way, an adhesive film according to the present invention was obtained. The adhesive film had a highly heat resistant polyimide layer of 17 μm in thickness and thermoplastic polyimide layers of 4 μm in thickness on both the sides of the highly heat resistant polyimide layer.

Using the thus obtained adhesive film, a flexible metal-clad laminate as a laminate according to the present invention was prepared in the same fashion as in Example 5.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 2.

Example 9

An adhesive film and a flexible metal-clad laminate according to the present invention were produced in the same fashion as in Example 5, except that the obtained film fixed using the tenter clips was elongated in the TD direction to an elongation ratio of 1.0.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 2.

Example 10

An adhesive film and a flexible metal-clad laminate according to the present invention were produced in the same fashion as in Example 8, except that the obtained film fixed using the tenter clips was elongated in the TD direction to an elongation ratio of 1.0.

A thermal shrinkage ratio of the thus obtained adhesive film was calculated from Equation (1), and evaluated. Further, dimensional change of the flexible metal-clad laminate were calculated from Equation (2) and evaluated. The results are shown on Table 2.

TABLE 2

|  | Thermal Shrinkage Ratio (%) | | Dimensional Change Ratio (%) | |
| --- | --- | --- | --- | --- |
|  | TD direction | MD direction | TD direction | MD direction |
| Example 5 | +0.06 | −0.10 | +0.04 | −0.03 |
| Example 6 | +0.04 | −0.09 | +0.03 | −0.03 |
| Example 7 | +0.05 | −0.09 | +0.05 | −0.04 |
| Example 8 | +0.04 | −0.08 | +0.05 | −0.04 |
| Example 9 | +0.01 | −0.06 | +0.12 | −0.11 |
| Example 10 | +0.01 | −0.05 | +0.11 | −0.12 |

As shown in Table 2, the flexible metal-clad laminates prepared using the adhesive films with the thermal shrinkage ratio within the prescribed range showed small dimensional change ratios. The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

As described above, an adhesive film according to the present invention is arranged such that a thermal shrinkage ratio in the TD direction has a lower limit, and a thermal shrinkage ratio in the MD direction has an upper limit. This arrangement makes it possible to control the overall thermal shrinkage ratios excellently. In case of a laminate in which a metal layer and the adhesive film are provided in lamination by a laminating method (especially, heat roll laminating method), heating process in which heat is applied on the laminate can be performed with sufficient reduction in the dimensional changes.

As a result, for example, it becomes possible to produce a flexible metal-clad laminate in which the dimensional changes are reduced. This attains a flexible wiring board such as FPC, in which fine wiring can be formed, and which allows miniaturization and weight reduction of electronic apparatuses.

Therefore, the present invention is applicable not only to fields in which various resin molded products, typically adhesive films and laminates containing polyimide, are used, but also to fields relating to production of electronic components in which such adhesive film and laminates are used.

The invention claimed is:

1. An adhesive film comprising:
    a heat resistant layer containing a non-thermoplastic polyimide; and
    an adhesive layer on at least one surface of the heat resistant layer, the adhesive layer containing a thermoplastic polyimide,
    wherein a thermal shrinkage ratio in a TD direction is +0.01% or more,
    wherein a thermal shrinkage ratio in an MD direction is −0.02% or less,
    wherein tensile elastic moduli in the TD direction and MD direction are within a range of 5.0 to 11 GPa, and
    wherein the thermal shrinkage ratio is calculated by subjecting the adhesive film to a heat shrinkage measurement process comprising:
        storing the adhesive film at 23° C. and 55% relative humidity for 2 days,
        measuring the adhesive film in a film dimension L1, heating the adhesive film to 250° C. for 30 minutes,
storing the adhesive film at 25° C. and 60% relative humidity for 2 days,
measuring the adhesive film in a film dimension L2,
calculating the thermal shrinkage ratio in the TD direction, and
calculating the thermal shrinkage ratio in the MD direction.

2. The adhesive film as set forth in claim 1, wherein the heat resistant layer and the adhesive layer on the at least one surface of the heat resistant layer are formed by a coextrusion-flow casting method.

3. The adhesive film as set forth in claim 1, wherein the heat resistant layer and the adhesive layer on the at least one surface of the heat resistant layer are formed by a gel applying method.

4. The adhesive film as set forth in claim 1, wherein the thermal shrinkage ratio in the TD direction is +0.03% or more, and the thermal shrinkage ratio in the MD direction is −0.05% or less.

5. The adhesive film as set forth in claim 1, wherein the adhesive layer is formed on each side of the heat resistant layer.

6. The adhesive film as set forth in claim 1, wherein the heat resistant layer contains a non-thermoplastic polyimide resin by 90 wt. % or more.

7. A laminate comprising an adhesive film comprising:
a heat resistant layer containing a non-thermoplastic polyimide; and
an adhesive layer on at least one surface of the heat resistant layer, the adhesive layer containing a thermoplastic polyimide,
wherein a thermal shrinkage ratio in a TD direction is +0.01% or more,
wherein a thermal shrinkage ratio in an MD direction is −0.02% or less,
wherein tensile elastic moduli in the TD direction and MD direction are within a range of 5.0 to 11 GPa, and
wherein the thermal shrinkage ratio is calculated by subjecting the adhesive film to a heat shrinkage measurement process comprising:
storing the adhesive film at 23° C. and 55% relative humidity for 2 days,
measuring the adhesive film in a film dimension L1,
heating the adhesive film to 250° C. for 30 minutes,
storing the adhesive film at 25° C. and 60% relative humidity for 2 days,
measuring the adhesive film in a film dimension L2,
calculating the thermal shrinkage ratio in the TD direction, and
calculating the thermal shrinkage ratio in the MD direction.

8. The laminate as set forth in claim 7 comprising a metal layer on the adhesive film.

9. A flexible wiring board comprising an adhesive film or a laminate comprising the adhesive film, the adhesive film comprising:
a heat resistant layer containing a non-thermoplastic polyimide; and
an adhesive layer on at least one surface of the heat resistant layer, the adhesive layer containing a thermoplastic polyimide,
wherein a thermal shrinkage ratio in a TD direction is +0.01% or more,
wherein a thermal shrinkage ratio in an MD direction is −0.02% or less
wherein tensile elastic moduli in the TD direction and MD direction are within a range of 5.0 to 11 GPa, and
wherein the thermal shrinkage ratio is calculated by subjecting the adhesive film to a heat shrinkage measurement process comprising:
storing the adhesive film at 23° C. and 55% relative humidity for 2 days,
measuring the adhesive film in a film dimension L1,
heating the adhesive film to 250° C. for 30 minutes,
storing the adhesive film at 25° C. and 60% relative humidity for 2 days,
measuring the adhesive film in a film dimension L2,
calculating the thermal shrinkage ratio in the TD direction, and
calculating the thermal shrinkage ratio in the MD direction.

10. A method for producing an adhesive film comprising:
concurrently supplying, into an extruder having a die for extruding in two or more layers, an organic solvent solution containing a polyamide acid that is a precursor of a non-thermoplastic polyimide, and either an organic solvent solution containing a thermoplastic polyimide, or an organic solvent solution containing a polyamide acid that is a precursor of the thermoplastic polyimide, and extruding the organic solvent solutions via an outlet of the die to form a film having at least two layers;
continuously supplying the extruded organic solvent solutions on a smooth-surfaced supporter, and volatilizing off at least part of an organic solvent or organic solvents from the film on the supporter in order to obtain a laminate film that is self-supportive; and
holding both edges of the laminate film in a TD direction and subjecting the laminate film to imidation while elongating the laminate film in the TD direction to an elongation ratio of greater than 1.0,
wherein the adhesive film comprises:
a heat resistant layer containing a non-thermoplastic polyimide, and
an adhesive layer on at least one surface of the heat resistant layer, the adhesive layer containing a thermoplastic polyimide,
wherein a thermal shrinkage ratio in the TD direction is +0.01% or more,
wherein a thermal shrinkage ratio in an MD direction is −0.02% or less,
wherein the heat resistant layer and the adhesive layer on the at least one surface of the heat resistant layer are formed by a coextrusion-flow casting method, and
wherein the thermal shrinkage ratio is calculated by subjecting the adhesive film to a heat shrinkage measurement process comprising:
storing the adhesive film at 23° C. and 55% relative humidity for 2 days,
measuring the adhesive film in a film dimension L1,
heating the adhesive film to 250° C. for 30 minutes,
storing the adhesive film at 25° C. and 60% relative humidity for 2 days,
measuring the adhesive film in a film dimension L2,
calculating the thermal shrinkage ratio in the TD direction, and
calculating the thermal shrinkage ratio in the MD direction.

11. A method for producing an adhesive film comprising:
forming a gel film by shaping, into a film-like shape, an organic solvent solution containing a polyamide acid, which is a precursor of a non-thermoplastic polyimide;

applying on at least one surface of the gel film an organic solvent solution containing a thermoplastic polyimide or an organic solvent solution containing a polyamide acid that is a precursor of the thermoplastic polyimide, and heating the gel film on which the organic solvent solution is applied; and holding both edges of the laminate film in a TD direction and subjecting the laminate film to imidation while elongating the laminate film in the TD direction to an elongation ratio of greater than 1.0, wherein the adhesive film comprises:
- a heat resistant layer containing the non-thermoplastic polyimide, and
- an adhesive layer on at least one surface of the heat resistant layer, the adhesive layer containing a thermoplastic polyimide, wherein a thermal shrinkage ratio in the TD direction is +0.01% or more, wherein a thermal shrinkage ratio in an MD direction is −0.02% or less, wherein the heat resistant layer and the adhesive layer on the at least one surface of the heat resistant layer are formed by a gel applying method, and wherein the thermal shrinkage ratio is calculated by subjecting the adhesive film to a heat shrinkage measurement process comprising:
- storing the adhesive film at 23° C. and 55% relative humidity for 2 days,
- measuring the adhesive film in a film dimension L1,
- heating the adhesive film to 250° C. for 30 minutes,
- storing the adhesive film at 25° C. and 60% relative humidity for 2 days,
- measuring the adhesive film in a film dimension L2,
- calculating the thermal shrinkage ratio in the TD direction, and
- calculating the thermal shrinkage ratio in the MD direction.

12. A method for producing a flexible wiring board including an adhesive film or a laminate comprising the adhesive film, the method comprising:

providing a metal foil on the adhesive film by a heat roll laminating method, wherein the adhesive film comprises:
- a heat resistant layer containing a non-thermoplastic polyimide, and
- an adhesive layer on at least one surface of the heat resistant layer, the adhesive layer containing a thermoplastic polyimide, wherein a thermal shrinkage ratio in a TD direction is +0.01% or more, wherein a thermal shrinkage ratio in an MD direction is −0.02% or less, and wherein the thermal shrinkage ratio is calculated by subjecting the adhesive film to a heat shrinkage measurement process comprising:
- storing the adhesive film at 23° C. and 55% relative humidity for 2 days,
- measuring the adhesive film in a film dimension L1,
- heating the adhesive film to 250° C. for 30 minutes,
- storing the adhesive film at 25° C. and 60% relative humidity for 2 days,
- measuring the adhesive film in a film dimension L2,
- calculating a thermal shrinkage ratio in the TD direction, and
- calculating a thermal shrinkage ratio in the MD direction.

* * * * *